United States Patent [19]
Matsukawa et al.

[11] Patent Number: 5,350,938
[45] Date of Patent: Sep. 27, 1994

[54] NONVOLATILE SEMICONDUCTOR MEMORY CIRCUIT WITH HIGH SPEED READ-OUT

[75] Inventors: Naohiro Matsukawa, Kamakura; Junichi Miyamoto, Yokohama, both of Japan

[73] Assignee: Kabushiki Kaisha Toshiba, Kawasaki, Japan

[21] Appl. No.: 721,702

[22] Filed: Jun. 26, 1991

[30] Foreign Application Priority Data

Jun. 27, 1990 [JP] Japan .................................. 2-166913

[51] Int. Cl.⁵ ........................................... H01L 29/68
[52] U.S. Cl. .................... 257/378; 257/316; 365/185
[58] Field of Search ............... 357/23.5, 43, 378, 316; 365/185, 177

[56] References Cited

U.S. PATENT DOCUMENTS

| | | | |
|---|---|---|---|
| 3,893,085 | 7/1975 | Hansen | 365/177 |
| 4,247,861 | 1/1981 | Hsu et al. | 357/43 |
| 4,435,790 | 3/1984 | Tickle et al. | 365/177 |

FOREIGN PATENT DOCUMENTS

59-74666  4/1984  Japan.

Primary Examiner—Robert Limanek
Attorney, Agent, or Firm—Banner, Birch, McKie & Beckett

[57] ABSTRACT

A memory cell transistor includes a semiconductor substrate, a N-type source region, a N-type drain region, a control gate and a P+-type emitter region, which is formed in the surface region of the drain region. An insulating film overlies the source region, the drain region, the emitter region, and the control gate. A contact hole is formed in the insulating film so that the surface of the emitter region is exposed. An emitter electrode is formed in and around the contact hole. A PNP vertical bipolar transistor is constituted by the semiconductor substrate serving as a collector region, a P+-type buried layer serving as a collector contact, and the drain region serving as a base region.

13 Claims, 5 Drawing Sheets

|  | S | E | CG | C |
|---|---|---|---|---|
| READ | 0V | 2V | 5V | 0V |
| WRITE | 0V | 0V | 20V | 0V |
| ERASE | 0V | 0V | -20V | 0V |

|  | S | E | CG | C |
|---|---|---|---|---|
| READ | 0V | 2V | 5V | 0V |
| WRITE | 6V | -7V | 12V | 0V |

FIG. 7

|  | S | E | CG | C |
|---|---|---|---|---|
| READ | 0V | 2V | 5V | 0V |
| WRITE | 9V | 0V | 15V | 0V |

FIG. 8

|  | BL1 | BL2 | WL1 | WL2 | SL |
|---|---|---|---|---|---|
| READ | 2V | — | 5V | 0V | 0V |
| WRITE | -7V | 0V | 12V | 0V | 6V |

NONVOLATILE SEMICONDUCTOR MEMORY CIRCUIT WITH HIGH SPEED READ-OUT

BACKGROUND OF THE INVENTION

1. Field of the Invention

This invention relates generally to a semiconductor integrated circuit such as a nonvolatile semiconductor memory, and more particularly to a nonvolatile memory cell from which data can be read out at a high speed and a nonvolatile semiconductor memory device having the same.

2. Description of the Related Art Nonvolatile semiconductor memory devices have been widely used, which comprise a multilayer-gate type nonvolatile memory cell transistor having a floating gate and a control gate. The nonvolatile semiconductor memory devices include an EEPROM (electrically erasable and programmable read only memory) and an EPROM (erasable and programmable read only memory).

The conventional multilayer-gate type nonvolatile memory cell transistor having a floating gate and a control gate has a threshold voltage higher than a normal MOS transistor. Hence, the current driving capacity thereof is low and data cannot be easily read out at high speed.

SUMMARY OF THE INVENTION

It is accordingly an object of the present invention to provide a nonvolatile semiconductor memory circuit comprising a nonvolatile memory cell from which data can be read out at a high speed.

According to an aspect of the present invention, there is provided a nonvolatile semiconductor memory circuit comprising:

a semiconductor substrate containing an impurity of a first conductivity type and functioning as the substrate of an MOS transistor and the collector of a bipolar transistor;

a first semiconductor region, formed in the surface region of said substrate, containing an impurity of a second conductivity type opposite to that of said substrate and functioning as the source of the MOS transistor;

a second semiconductor region, formed in the surface region of said semiconductor substrate and separated from said first semiconductor region, containing an impurity of the second conductivity type and functioning as the drain of the MOS transistor and the base of the bipolar transistor;

a first gate insulating film formed on that portion of said semiconductor substrate which is located between said first and second semiconductor regions;

a floating gate formed on said first gate insulating film;

a second gate insulating film formed on said floating gate;

a control gate formed on said second gate insulating film; and an impurity region formed in contact with said second semiconductor region, containing an impurity of the first conductivity type and functioning as the emitter of the bipolar transistor.

According to another aspect of the present invention, there is provided a nonvolatile semiconductor memory circuit comprising:

a plurality of memory cells arranged in a matrix, each of said memory cells comprising:

a semiconductor substrate containing an impurity of a first conductivity type and functioning as a substrate of an MOS transistor and the collector of a bipolar transistor;

a first semiconductor region, formed in the surface region of said substrate, containing an impurity of a second conductivity type opposite to that of said substrate and functioning as the source of the MOS transistor;

a second semiconductor region, formed in the surface region of said semiconductor substrate and separated from said first semiconductor region, containing an impurity of the second conductivity type and functioning as the drain of the MOS transistor and the base of the bipolar transistor;

a first gate insulating film formed on that portion of said semiconductor substrate which is located between said first and second semiconductor regions;

a floating gate formed on said first gate insulating film;

a second gate insulating film formed on said floating gate;

a control gate formed on said second gate insulating film; and an impurity region, formed in contact with said second semiconductor region, containing an impurity of the first conductivity type and functioning as the emitter of the bipolar transistor, said memory circuit further comprising:

a plurality of word lines connecting the control gates of said memory cells in rows;

a plurality of bit lines connecting the impurity regions of said memory cells in columns; and a source line connecting the first semiconductor regions of the memory cells.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described with reference to the accompanying drawings.

Figure 1:
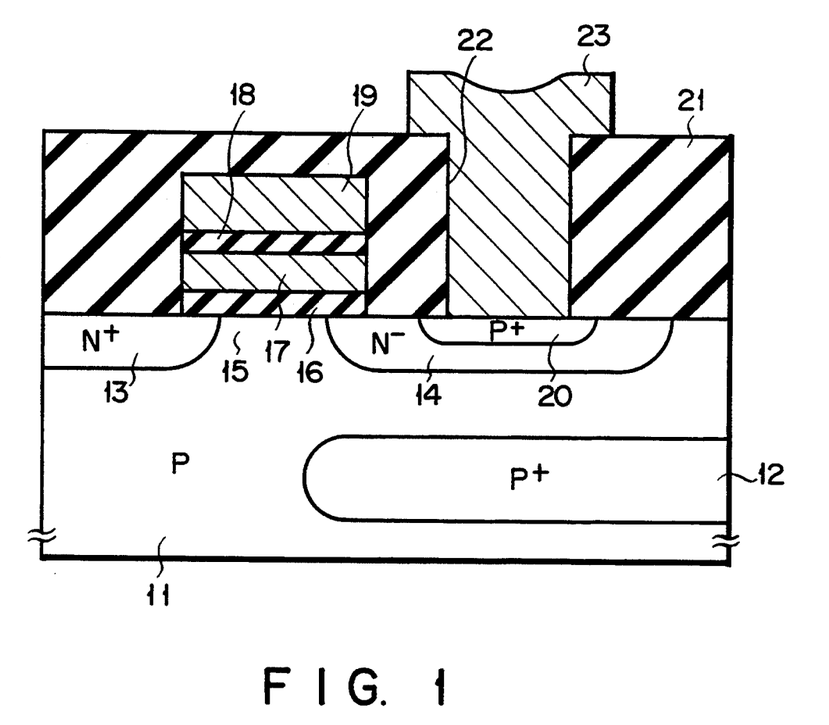
FIG. 1 is a cross-sectional view showing the element structure of a nonvolatile memory cell according to a first embodiment of the present invention.

FIG. 1 is a cross-sectional view of a nonvolatile memory cell according to a first embodiment of the present invention.

FIG. 1 shows a P-type semiconductor substrate 11 having a resistivity of 5Ω on a plane [100]. A P+-type buried layer 12 is formed in the substrate 11. The surface region of the substrate 11 includes an N+-type source region 13 of 0.2 μm in depth, doped with an N-type impurity of a concentration of $1 \times 10^{20}/cm^3$, and an N−-type drain region 14 of 0.5 μm in depth, doped with an N-type impurity of a concentration of $1 \times 10^{17}/cm^3$. The source and drain regions 13 and 14 are separated from each other by a channel region 15 interposed therebetween. The channel region 15 is 0.6 μm in length and 0.9 μm in width. A floating gate 17 made of polysilicon and having a thickness of 100 nm is formed on the channel region 15 with a first gate oxide film 16 having a thickness of 10 nm provided therebetween. A control gate 19 made of polysilicon having a thickness of 400 nm is formed on the floating gate 17 with a second gate oxide film 18 having a thickness of 20 nm provided therebetween.

The source region 13, the drain region 14, the first gate oxide film 16, the floating gate 17, the second gate oxide film 18, and the control gate 19 constitute a multilayer-gate type nonvolatile memory cell transistor. The substrate 11 serves as the substrate of the memory cell transistor.

The surface region of the drain region 14 includes a P+-type emitter region 20 of 0.3 μm in depth, doped with a P-type impurity of a concentration of $1 \times 10^{20}/cm^3$. An insulating film 21 overlies the source region 13, the drain region 14, the emitter region 20, and the control gate 19. A contact hole 22 is formed in the insulating film 21, so that a portion of the surface of the emitter region 20 is exposed. An emitter electrode made of aluminum or the like 23 is formed in and around the contact hole 22.

The semiconductor substrate 11 functioning as a collector region, the P+ buried layer 12 as a collector contact, and the drain region 14 as a base region constitute a PNP vertical bipolar transistor including the emitter region 20.

Figure 2:
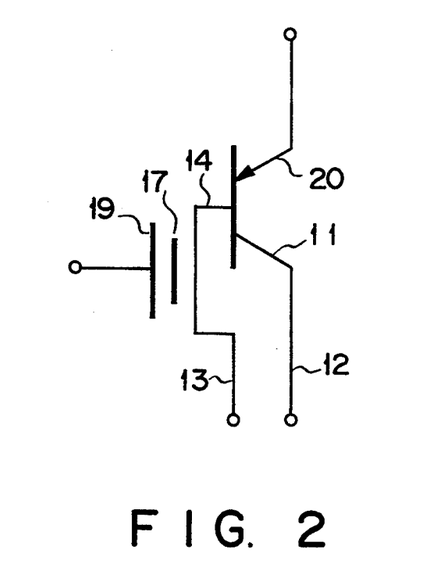
FIG. 2 is a diagram showing an equivalent circuit of the memory cell shown in FIG. 1.

FIG. 2 shows an equivalent circuit of the nonvolatile memory device shown in FIG. 1. In FIG. 2, each element is accompanied by the same numeral as that of the corresponding element in FIG. 1. In the following descriptions, the control gate, the source, and the drain of the memory cell transistor may be represented by CG, S, and D, respectively, and the emitter and the collector of the bipolar transistor by E and C, respectively.

Figure 3:
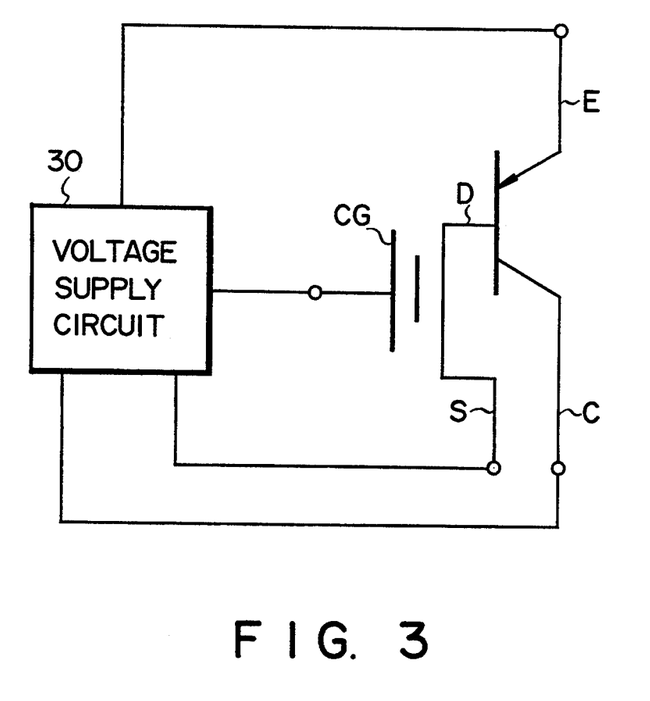
FIG. 3 is a circuit diagram showing a nonvolatile semiconductor memory device having the memory cell shown in FIG. 1.

FIG. 3 is a circuit diagram showing a nonvolatile semiconductor memory device comprising a nonvolatile memory cell shown in FIG. 1. In FIG. 3, a voltage supply circuit 30 generates various voltages for driving the above-mentioned memory cell, and is connected to the control gate CG, the source S, the emitter E, and the collector C of the memory cell.

Figure 4:
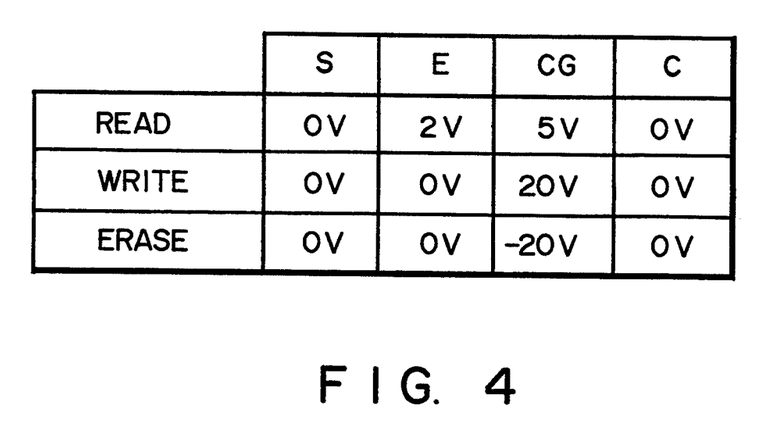
FIG. 4 is a diagram showing voltages applied to portions of the memory device shown in FIG. 3.

A method of driving the cell by means of the voltage supply circuit 30 will be described below with reference to FIG. 4.

First, a data reading operation will be described. When data is read out from the nonvolatile memory cell transistor, the voltage supply circuit 30 outputs various voltages. The output voltages of 0 V, 2 V, 5 V, and 0 V are respectively applied to the source S, the emitter E, the control gate CG, and the collector C. when the voltage of 5 V is applied to the control gate CG, the memory cell transistor which is erased is turned on, with the result that a drain current flows, thereby turning on the bipolar transistor. At this time, the voltage at the drain D decreases from 2 V to 1.4V, i.e., decreases by the value of the base-emitter voltage of the bipolar transistor, and a channel current of about 100 μA flows through the bipolar transistor as a base current thereof. As a result, the base current is amplified to an emitter current, which is 10 times as large as the base current. The current amplified to about 1 mA contributes to the discharge of a bit line (not shown) connected to the emitter E of the bipolar transistor.

Thus, the current driving capacity for a bit line is considerably increased as compared to a conventional nonvolatile memory cell transistor of a multilayer-gate type having a floating gate and a control gate. Accordingly, data can be read out at a higher speed. In addition, since the emitter is formed within the drain of the memory cell transistor, the increase in size of the cell is suppressed.

A data writing operation is performed by applying a high voltage to a portion between the control gate 19 and at least one of the semiconductor substrate 11, the source region 13 and the drain region 14, thereby tunnel-injecting a charge to the floating gate 17. The voltage supply circuit 30 outputs various voltages. For example, as is shown in FIG. 4, a voltage of 0 V is applied to the source S, the emitter E, and the collector C, and a voltage of 20 V to the control gate CG. As a result, electrons are injected from the source S to the floating gate 17, tunneling through the first gate oxide film 16. Even if that portion of the first gate oxide film 16 which does not in contact with the source region 13 is thicker than 10 nm, electrons can be injected from the source 13 to the floating gate 17, tunneling through the first gate oxide film 16.

When data in the memory cell transistor in the nonvolatile semiconductor memory device of FIG. 3 is erased, the voltage supply circuit 30 applies a voltage of 0 V to the source S, the emitter E, and the collector C, and a voltage of −20 V to the control gate CG. As a result, electrons flows in a direction reverse to that in the above-mentioned writing operation, thereby discharging the floating gate 17. Thus, the data in the memory cell transistor is erased.

Figure 5:
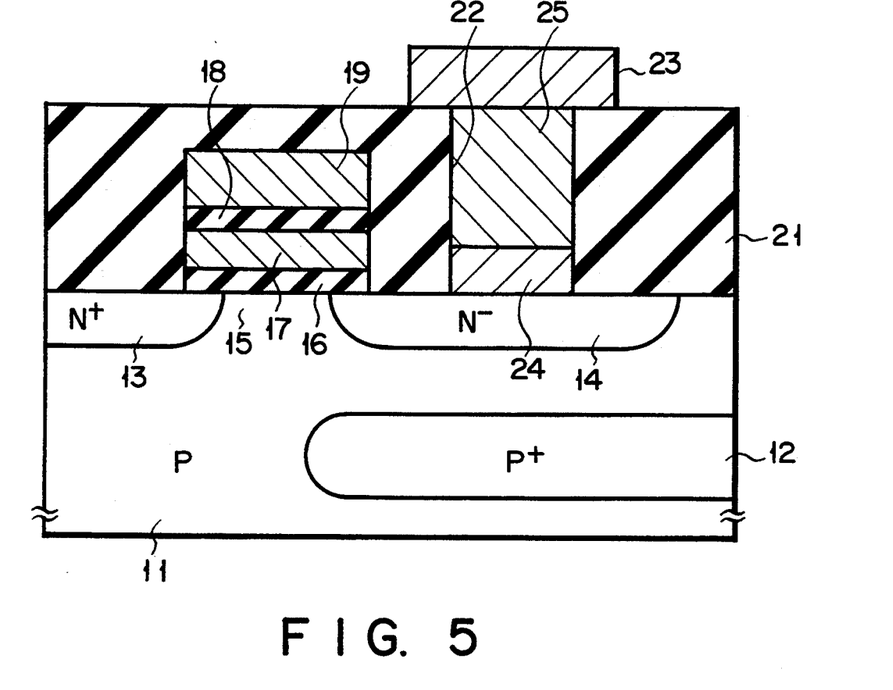
FIG. 5 is a cross-sectional view showing the element structure of a nonvolatile memory cell according to a second embodiment of the present invention.

FIG. 5 shows a nonvolatile memory cell according to a second embodiment of the present invention. In the memory cell shown in FIG. 5, a P+-type semiconductor region 24 serving as an emitter is formed in contact with the drain region 14, in place of the P+ type emitter region 20 in the bipolar transistor shown in FIG. 1. A polycrystalline silicon layer 25 containing a P+ type impurity is deposited on the semiconductor region 24 in the contact hole 22. An emitter electrode 23 made of aluminum is formed on the polycrystalline silicon layer 25.

In the memory cell of this embodiment, the P+ type semiconductor region 24 formed in the contact hole 22 is used as an emitter of the bipolar transistor.

Figure 6:
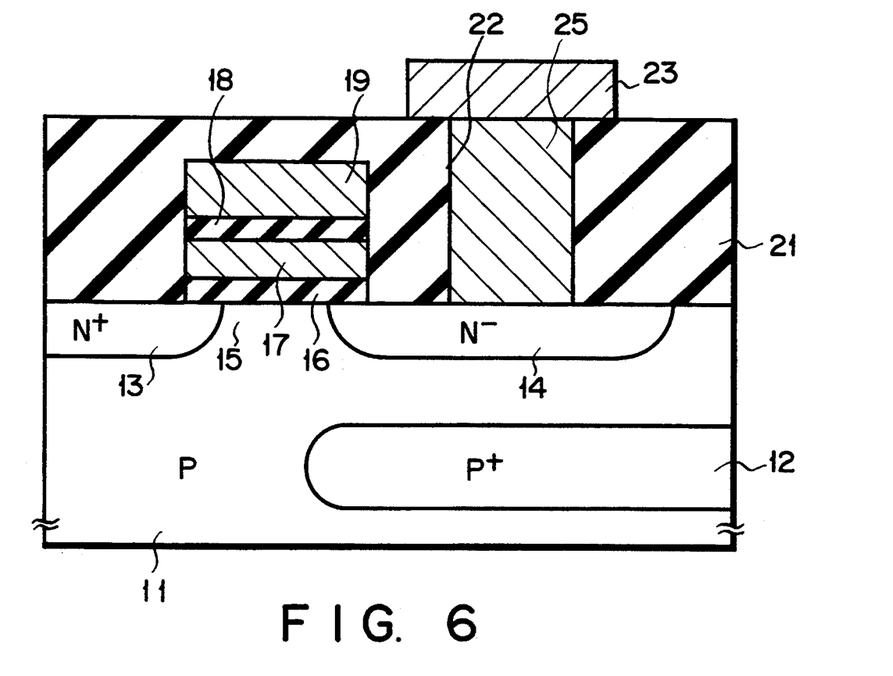
FIG. 6 is a cross-sectional view showing the element structure of a nonvolatile memory cell according to a third embodiment of the present invention.

FIG. 6 shows a nonvolatile memory cell according to a third embodiment of the present invention. In the memory cell shown in FIG. 6, a polycrystalline silicon layer 25 containing a P+ type impurity and functioning as an emitter is deposited in the contact hole 22, in place of the P+type emitter region 20 in FIG. 1. In other words, this embodiment differs from the second embodiment in that the contact hole 22 is filled with the polycrystalline silicon 25 without forming the semiconductor region 24. Accordingly, the P+ type polycrystalline silicon layer 25 containing a P+ type impurity serves as an emitter of the bipolar transistor.

A nonvolatile memory cell according to a fourth embodiment of the present invention will now be described. The equivalent circuit of the nonvolatile memory cell is the same as that of the first embodiment shown in FIG. 2, and the cross-section thereof is the same as that shown in FIG. 1. The fourth embodiment differs from the first embodiment only in that the first gate oxide film 16 is twice as thick as that in the first embodiment, i.e. 20nm, and hence the capacitance between the semiconductor substrate 11 and the floating gate 17 is half of that in the first embodiment. Accordingly, the capacitance between the floating gate 17 and the control gate 19 is half of that in the first embodiment. The other portions are the same as those in the first embodiment.

Figure 7:
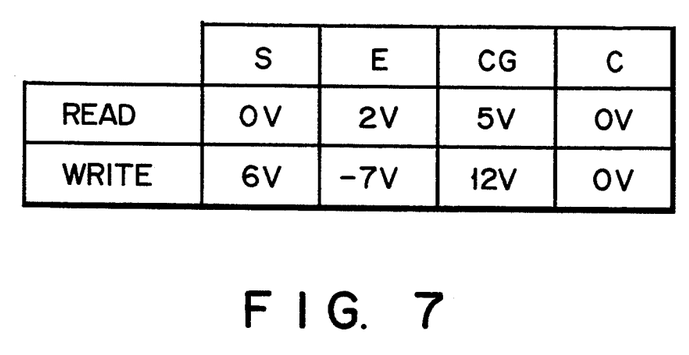
FIG. 7 is a diagram showing voltages applied to the source, the emitter, the control gate, and the collector of a nonvolatile memory cell according to a fourth embodiment of the present invention.

In a reading operation, the nonvolatile memory cell according to the fifth embodiment is driven by the voltage supply circuit in the same manner as in the first embodiment, as is shown in FIG. 7. In a writing operation, a first voltage is applied to the control gate CG, a second voltage of the same polarity as that of the first voltage is applied to the source S, and a third voltage of the opposite polarity is applied to the emitter E. The third voltage is approximate to the junction breakdown voltage in the reverse direction between the emitter and the drain. The first to third voltages cause a channel current to flow, thereby generating channel hot carriers, which are injected into the floating gate 17. For example, voltages of 12 V, 6 V, −7 V, and 0 V are respectively applied to the control gate CG, the source S, the emitter E, and the collector C, as is shown in FIG. 7. In this case, since the impurity concentration of the drain D is $1 \times 10^{17}$ cm$^3$ as described above, the junction breakdown voltage in the reverse direction between the emitter and the drain is approximately 7 V. The drain D is fixed at the voltage of 0 V, and the breakdown current flows from the source S through the drain D to the emitter E as a channel current. At this time, hot electrons generated near the source are injected into the floating gate 17, thus executing a writing operation.

In this embodiment, a data erasing operation in the memory cell is performed by applying ultraviolet lights.

A nonvolatile memory cell according to a fifth embodiment of the present invention will now be described. The equivalent circuit of the nonvolatile memory cell is the same as that of the first embodiment shown in FIG. 2, and the cross-section thereof is the same as that shown in FIG. 1. The fifth embodiment differs from the first embodiment only in that the impurity concentration of the entire drain region 14 is set higher than that in the first embodiment, e.g. $3 \times 10^{17}$ cm$^3$. Accordingly, the breakdown voltage in the reverse direction between the emitter and the drain is 6 V or lower, for example, 3 V. The other portions of the fifth embodiment are the same as those in the first embodiment.

Figure 8:
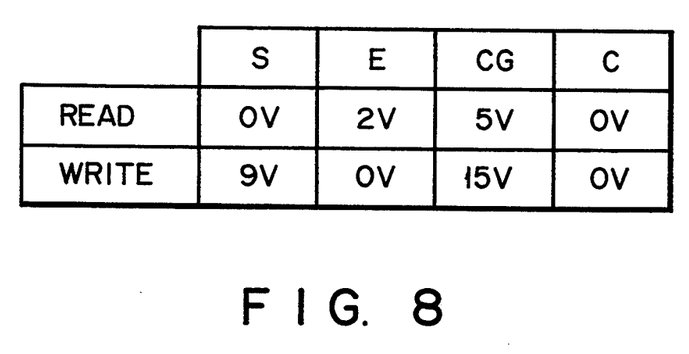
FIG. 8 is a diagram showing voltages applied to the source, the emitter, the control gate, and the collector of a nonvolatile memory cell according to a fifth embodiment of the present invention.

In a reading operation, the nonvolatile memory cell according to the fifth embodiment is driven by the voltage supply circuit in the same manner as in the first embodiment, as is shown in FIG. 8. In a writing operation, a fourth voltage is applied to the control gate CG, a fifth voltage of the same polarity as that of the fourth voltage is applied to the source S, and the emitter E is grounded. These voltages cause a channel current to flow, thereby generating channel hot carriers, which are injected into the floating gate 17. For example, voltages of 15 V, 9 V, 0 V, and 0 V are respectively applied to the control gate CG, the source S, the emitter E, and the collector C, as is shown in FIG. 8. In this case, the emitter E is fixed at the voltage of 3 V, i.e., the breakdown voltage in the reverse direction between the emitter and the drain, and the junction breakdown current flows from the source S through the drain D to the emitter E as a channel current. At this time, hot electrons generated near the source are injected into the floating gate 17, thus executing a writing operation.

Figure 9:
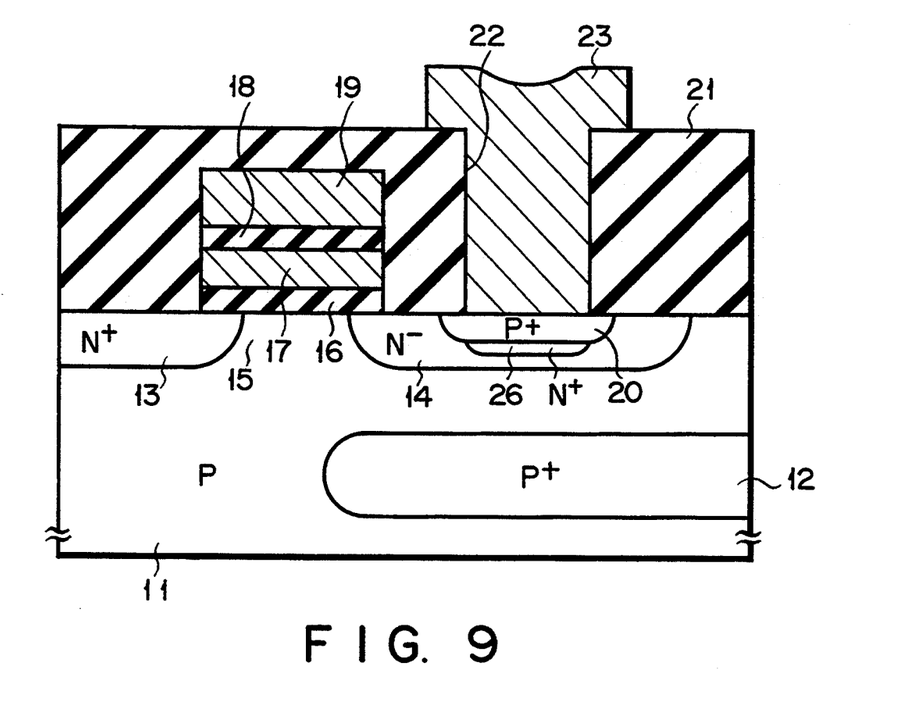
FIG. 9 is a cross-sectional view showing the element structure of a nonvolatile memory cell according to a sixth embodiment of the present invention.

FIG. 9 shows a sixth embodiment of the present invention. In the fifth embodiment, the impurity concentration of the entire drain region is set higher than that of the first embodiment, thereby reducing the breakdown voltage in the reverse direction between the emitter and the drain. However, in the sixth embodiment, the drain region 14 include an N+-type semiconductor region 26 which has an impurity concentration higher than that of the other portion thereof and abuts on the emitter region 20. In this embodiment also, the breakdown voltage in the reverse direction between the emitter and the drain is lower than that of the first embodiment.

According to the first to sixth embodiments, the nonvolatile memory cell has approximately the same area as that of the conventional nonvolatile memory cell transistor, since the emitter is formed within the contact hole 22 in a self-aligning manner.

Figure 10:
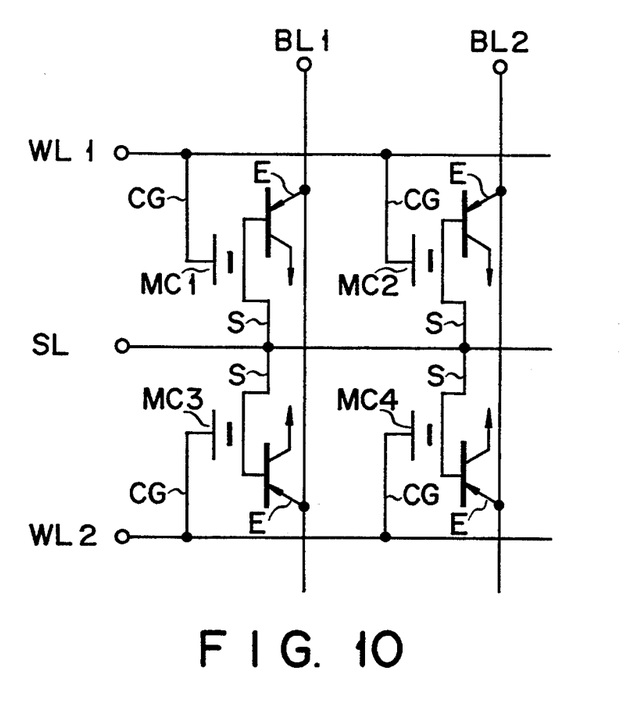
FIG. 10 is a circuit diagram showing a nonvolatile semiconductor memory circuit according to a seventh embodiment of the present invention.

Next, a nonvolatile semiconductor memory circuit according to a seventh embodiment of the present invention will be described. This embodiment differs from the first embodiment shown in FIG. 1 in that the nonvolatile memory cells are arranged in a matrix. FIG. 10 is a circuit diagram showing an example of the seventh embodiment, in which four nonvolatile memory cells MC1 to MC4 are arranged in a matrix. The control gates CG of the memory cells MC1 and MC2 in one row are connected to a word line WL1. The control gates CG of the remaining memory cells MC3 and MC4 in the other row are connected to a word line WL2. The emitters E of the memory cells MC1 and MC3 in one column are connected to a bit line BL1, and those of the memory cells MC2 and MC4 in the other column to the other bit line BL2. The sources S of all of the memory cells MC1 to MC4 are connected to a source line SL, and the collectors C thereof are grounded.

Figure 11:
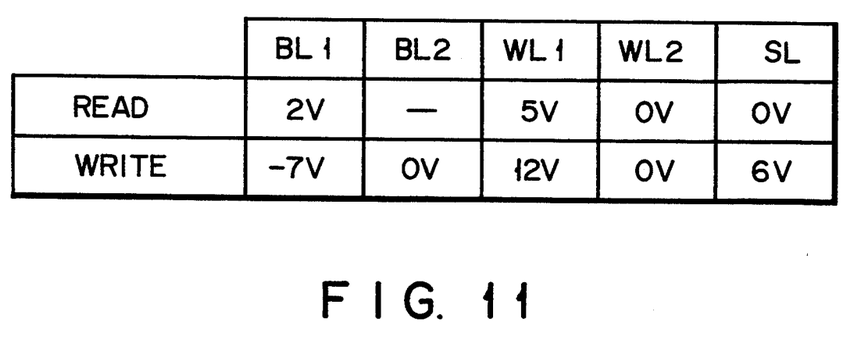
FIG. 11 is a diagram showing voltages applied to the bit lines the word lines and the source of the nonvolatile semiconductor memory device shown in FIG. 10.

In the above-described memory circuit, voltages used when data is written into or read from the memory cells are the same as those shown in FIG. 7. More specifically, as is shown in FIG. 11, in a data reading operation, voltages of 5 V and 0 V are respectively applied to the word lines WL1 and WL2, so that the voltage of 5 V is applied to the control gate of a selected memory cell, and the voltage of 0 V to that of a non-selected memory cell. A voltage of 2 V is selectively applied to the bit line BL1 or BL2, so that it is applied to the emitter E of the selected memory cell. A voltage of 0 V is applied to the source line SL.

In a data writing operation, voltages of 12 V and 0 V are respectively applied to the word lines WL1 and WL2, so that the voltage of 12 V is applied to the control gate CG of a selected memory cell, and the voltage of 0 V to that of a non-selected memory cell. A voltage of −7 V is selectively applied to the bit line BL1 or BL2, so that it is applied to the emitter E of the selected memory cell. A voltage of 6V is applied to the source line SL.

The above-description of the seventh embodiment is related to the nonvolatile semiconductor memory circuit having memory cells according to the fourth embodiment. However, the memory cells of the embodiments shown in FIGS. 5, 6, and 9 can be used in the seventh embodiment.

As has been described above, according to the present invention, the cell current flowing in a reading operation can be increased by several times that of the conventional nonvolatile memory cell transistor having the same area as that of this invention. Hence, the semiconductor integrated circuit having a nonvolatile memory cell of the present invention can perform a reading operation at a higher speed. Accordingly, a Bi (bipolar) or CMOS (complementary insulating gate type) high speed EPROM, EEPROM, and the like can be provided. Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A nonvolatile semiconductor memory device, comprising:
   a semiconductor body of a first conductivity type having a major surface;
   a MOS transistor, comprising:
      first and second spaced regions of a second conductivity type in said major surface of said semiconductor body, each of said first and second spaced regions having a surface;
      a first insulating layer on said major surface of said semiconductor body and extending at least between said first and second spaced regions;
      a first gate on said first insulating layer;
      a second insulating layer on said first gate; and
      a second gate on said second insulating layer;
   a bipolar transistor, comprising:
      an emitter region of the first conductivity type, said emitter region formed on said surface of said second spaced region and in contact therewith, said second spaced region comprising a base of said bipolar transistor, and said semiconductor body comprising a collector of said bipolar transistor;
   a semiconductor layer containing an impurity of the first conductivity type on said emitter region;
   a collector contact region comprising a buried region of the first conductivity type within said semiconductor body and spaced from said major surface thereof; and
   a voltage supply circuit for supplying a first voltage having a first polarity to said second gate, a second voltage having the first polarity to said first spaced region, and a third voltage to said emitter region, the third voltage having a second polarity and a value approximately equal to a reverse junction breakdown voltage between said emitter region and said second spaced region, to thereby generate a channel current between said first and second spaced regions and inject hot carriers generated by the channel current into said first gate for data writing.

2. A nonvolatile semiconductor memory device, comprising:
   a semiconductor body of a first conductivity type having a major surface;
   a MOS transistor, comprising:
      first and second spaced regions of a second conductivity type in said major surface of said semiconductor body, each of said first and second spaced regions having a surface;
      a first insulating layer on said major surface of said semiconductor body and extending at least between said first and second spaced regions;
      a first gate on said first insulating layer;
      a second insulating layer on said first gate; and
      a second gate on said second insulating layer;
   a bipolar transistor, comprising:.
      an emitter region of the first conductivity type, said emitter region formed on said surface of said second spaced region and in contact therewith, said second spaced region comprising a base of said bipolar transistor, and said semiconductor body comprising a collector of said bipolar transistor;
   a semiconductor layer containing an impurity of the first conductivity type on said emitter region:
   a collector contact region comprising a buried region of the first conductivity type within said semiconductor body and spaced from said major surface thereof,
   wherein an impurity concentration of said second spaced region is fixed so that a reverse junction breakdown voltage between said emitter region and said second spaced region is equal to or less than approximately six volts; and
   a voltage supply circuit for supplying a first voltage having a first polarity to said second gate, a second voltage having the first polarity to said first spaced region, and a ground voltage to said emitter region, to thereby generate a channel current between said first and second spaced regions and inject hot carriers generated by the channel current into said first gate for data writing.

3. The nonvolatile semiconductor memory device according to claim 1, wherein at least a portion of said buried region is beneath said second spaced region.

4. A nonvolatile semiconductor memory device, comprising:
   a semiconductor body of a first conductivity type having a major surface;
   a MOS transistor, comprising:
      first and second spaced regions of a second conductivity type in said major surface of said semiconductor body, each of said first and second spaced regions having a surface;
      a first insulating layer on said major surface of said semiconductor body and extending at least between said first and second space regions:
      a first gate on said first insulating layer;
      a second insulating layer on said first gate; and
      a second gate on said second insulating layer; and
   a bipolar transistor, comprising:
      an emitter region of the first conductivity type, said emitter region formed within said second spaced region, said second spaced region comprising a base of said bipolar transistor, and said semiconductor body comprising a collector of said bipolar transistor;
      a collector contact region comprising a buried region of the first conductivity type within said semiconductor body and spaced from said major surface thereof;
      a region of the second conductivity type completely within and surrounded by said second spaced region adjacent to and contacting said emitter region and having an impurity concentration higher than that of said second spaced region.

5. The nonvolatile semiconductor memory device according to claim 1, wherein said second spaced region comprises a drain region.

6. A nonvolatile semiconductor memory device, comprising:
   a semiconductor body of a first conductivity type having a major surface:
   a MOS transistor, comprising:
      first and second spaced regions of a second conductivity type in said major surface of said semiconductor body, said first and second spaced regions each having a surface;
      a first insulating layer on said major surface of said semiconductor body and extending at least between said first and second spaced regions;
      a first gate on said first insulating layer;
      a second insulating layer on said first gate; and
      a second gate on said second insulating layer;
      a third insulating layer on at least said second spaced region;
   a contact hole through said third insulating layer, exposing a portion of said surface of said second spaced region;
   a bipolar transistor, comprising:
      an emitter region of the first conductivity type formed in said contact hole and disposed on the exposed surface portion of said second spaced region and in contact therewith, said second spaced region comprising a base of said bipolar transistor, and said semiconductor body comprising collector of said bipolar transistor;
      a semiconductor layer containing an impurity of the first conductivity type which is formed in said contact hole and on said emitter region; and
      a collector contact region connected to said collector.

7. The nonvolatile semiconductor memory device according to claim 6, wherein said collector contact region comprises said major buried region of the first conductivity type formed within said semiconductor body and spaced from a surface thereof.

8. The nonvolatile semiconductor memory device according to claim 7, wherein at least a portion of said buried region is beneath said second spaced region.

9. The nonvolatile semiconductor memory device according to claim 6, wherein said emitter region comprises a polycrystalline silicon layer containing impurities of the first conductivity type contacting said second spaced region.

10. A semiconductor memory device, comprising:
   a plurality of memory cells arranged in a row and column array, each memory, cell comprising a MOS transistor having first and second current terminal regions formed in a semiconductor substrate, a control gate and a floating gate, a bipolar transistor having an emitter region formed on the surface of said second terminal region and in contact therewith, a base formed by said second current terminal region, and a collector formed by said semiconductor substrate, and a semiconductor layer containing an impurity of the first conductivity type formed on said emitter region;
   bit lines coupled to the emitters of the bipolar transistors of the memory cells in a column of said array;
   word lines coupled to the control gates of the MOS transistors of the memory cells in a row of said array;
   source lines coupled to the first current terminal regions of said MOS transistors of said memory cells;
   a reference potential to which the collectors of said bipolar transistors of said memory cells are connected; and
   a voltage supply circuit for supplying a first voltage having a first polarity to said control gates, a second voltage having the first polarity to said first current terminal regions, and a ground voltage to said emitter regions, to thereby generate channel currents between said first and second current terminal regions and inject hot carriers generated by the channel currents into said floating gates for data writing.

11. A semiconductor memory device, comprising:
   a plurality of memory cells arranged in a row and column array, each memory cell comprising a MOS transistor having first and second current terminal regions formed in a semiconductor substrate, a control gate and a floating gate, and a bipolar transistor having an emitter region formed by a region of the first conductivity type in said second current terminal region, a base formed by said second current terminal region, a collector formed by said semiconductor substrate, and a region of the second conductivity type in said second current terminal region which is adjacent to and in contact with said emitter region and has an impurity concentration higher than that of said second current terminal region;
   bit lines coupled to the emitters of the bipolar transistors of the memory cells in a column of said array;

word lines coupled to the control gates of the MOS transistors of the memory cells in a row of said array;

source lines coupled to the first current terminal regions of said MOS transistors of said memory cells;

a reference potential to which the collectors of said bipolar transistors of said memory cells are connected; and a voltage supply circuit for supplying a first voltage having a first polarity to said control gates, a second voltage having the first polarity to said first current terminal regions, and a ground voltage to said emitter regions, to thereby generate channel currents between said first and second currents terminal regions and inject hot carders generated by the channel currents into said floating gates for data writing.

12. The nonvolatile semiconductor memory device according to claim 4, wherein said region of the second conductivity type is surrounded by said second spaced region.

13. The nonvolatile semiconductor memory device according to claim 6, wherein said contact hole is formed through said third insulating layer from an upper surface of said third insulating layer to said portion of said surface of said second spaced region.

* * * * *